United States Patent
Botula et al.

(10) Patent No.: US 8,492,868 B2
(45) Date of Patent: Jul. 23, 2013

(54) METHOD, APPARATUS, AND DESIGN STRUCTURE FOR SILICON-ON-INSULATOR HIGH-BANDWIDTH CIRCUITRY WITH REDUCED CHARGE LAYER

(75) Inventors: Alan B. Botula, Essex Junction, VT (US); Alvin J. Joseph, Williston, VT (US); James A. Slinkman, Montpelier, VT (US); Randy L. Wolf, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 348 days.

(21) Appl. No.: 12/848,558

(22) Filed: Aug. 2, 2010

(65) Prior Publication Data

US 2012/0025345 A1  Feb. 2, 2012

(51) Int. Cl.
*H01L 29/06* (2006.01)
*H01L 21/762* (2006.01)

(52) U.S. Cl.
USPC ........... 257/503; 257/506; 257/510; 257/501; 257/E21.546; 257/E27.112; 438/424; 438/437

(58) Field of Classification Search
USPC .................. 257/503, 506, 510, 501, E21.546, 257/E27.112; 438/424, 437
See application file for complete search history.

(56) References Cited

U.S. PATENT DOCUMENTS

| | | | |
|---|---|---|---|
| 6,696,352 B1 * | 2/2004 | Carr et al. | 438/458 |
| 7,460,852 B2 | 12/2008 | Burgener et al. | |
| 7,547,939 B2 | 6/2009 | Simin et al. | |
| 7,613,442 B1 | 11/2009 | Kelly et al. | |
| 2006/0001124 A1 * | 1/2006 | Ayazi et al. | 257/531 |
| 2010/0035403 A1 | 2/2010 | Brown et al. | |

OTHER PUBLICATIONS

Kerr et al. "Identification of RF harmonic distortion on Si substrates and its reduction using a trap-rich layer", IEEE pp. 151-154 2008.*
US 7,529,532, 05/2009, Kelly et al. (withdrawn).
Lederer et al., "Effective Resistivity of Fully-Processed SOI Substrates", Solid-State Electronics No. 49, 2005, pp. 491-496.
Kerr et al., "Identification of RF Harmonic Distortion on Si Substrates and Its Reduction Using a Trap-Rich Layer", IEEE, 2008, pp. 151-154.
U.S. Appl. No. 12/507,150, filed Jul. 22, 2009, "Method and Structures for Improving Substrate Loss and Linearity in Soi Substrates", Jack Friedman et al.

* cited by examiner

*Primary Examiner* — Matthew Reames
*Assistant Examiner* — Benjamin Tzu-Hung Liu
(74) *Attorney, Agent, or Firm* — Gibb & Riley, LLC; David A. Cain, Esq.

(57) ABSTRACT

A method, integrated circuit and design structure includes a silicon substrate layer having trench structures and an ion impurity implant. An insulator layer is positioned on and contacts the silicon substrate layer. The insulator layer fills the trench structures. A circuitry layer is positioned on and contacts the buried insulator layer. The circuitry layer comprises groups of active circuits separated by passive structures. The trench structures are positioned between the groups of active circuits when the integrated circuit structure is viewed from the top view. Thus, the trench structures are below the passive structures and are not below the groups of circuits when the integrated circuit structure is viewed from the top view.

16 Claims, 5 Drawing Sheets

METHOD, APPARATUS, AND DESIGN STRUCTURE FOR SILICON-ON-INSULATOR HIGH-BANDWIDTH CIRCUITRY WITH REDUCED CHARGE LAYER

BACKGROUND

1. Field of the Invention

The present invention generally relates to a method, integrated circuit structure, and design structure, that utilize silicon-on-insulator (SOI) high-bandwidth circuitry and more specifically, to embodiments that utilize ion implantation combined with lattice trenches formed around active structures to eliminate the formation of a charge layer between a wafer and an oxide layer.

2. Description of Related Art

As explained in "Identification of RF Harmonic Distortion on Si Substrates and its Reduction Using a Trap-Rich Layer" by Kerr, et al. (IEEE, 2008) hereinafter "Kerr," high-resistivity silicon (HRS) substrates are promising for radio frequency (RF) applications due to their reduced substrate loss and coupling, which helps to enable RF cellular transmit switches on silicon-on-insulator using HRS handle wafers. The thin-film silicon-on-insulator structures use substrates having very high resistance (of 1 k Ohm-cm or more) which provides high isolation, low loss and reduces the possibility of latch up in high bandwidth applications such as RF circuitry.

As explained in Kerr, a high-resistivity silicon substrate has resistivity of about 1 kΩ-cm or higher, which corresponds to a doping level of $1\times10^{13}$ cm$^{-3}$ or lower. Due to this low doping level; even a small amount of fixed-oxide charge or interface-trapped charge can strongly affect the band bending at the interface. A Si—SiO$_2$ interface has positive fixed-oxide charge near the interface, which is strong enough to invert the Si surface. This inversion layer, called a parasitic conduction layer, partially spoils the expected benefits in substrate loss and coupling.

Unlike some compound semiconductors, the silicon interface does not have a high concentration of interface traps pinning the surface Fermi level, which is why silicon is useful for metal oxide semiconductor (MOS) devices. Furthermore, like a MOS device, an applied electric field also changes the band-bending and the surface charge state, or in other words, the capacitance depends on the voltage, which can be a source of harmonic distortion.

One might expect that if the frequency of the voltage wave is higher than the reciprocal of the majority-carrier dielectric relaxation time, or about 10 MHz for HRS, then the carriers cannot respond. However, if the entire interface is inverted, then the carriers can move laterally along the interface, and their response time is fast enough to follow the RF signal.

Thus, a byproduct of using HRS substrates is the possible formation of a charge layer at the handle wafer/oxide interface. The fixed-oxide and interface charges induce a parasitic surface conduction layer, which is an electron inversion layer. This charge layer greatly reduces the effective substrate resistance (to the order 50 Ohm-cm). Further, the charge layer can cause the effective substrate resistance to change depending on the alternating current (AC) voltage on the top side of the wafer, causing a non-linear behavior in any circuit. The outcome of this charge layer was found to cause high loss, low isolation and low linearity.

The Kerr paper explains some solutions to the problem of the charge layer that occurs and the handle wafer/oxide interface. More specifically, Kerr provides a trap-rich layer that significantly reduces harmonic distortion originating from the HRS substrate. Other solutions mentioned by Kerr include adding a shield layer under transmission lines, using GaAs substrate or silicon on sapphire (SOS) substrate, or forming a conventional SOI structure, and then removing the handle wafer and replacing it with a trap rich layer. However, such solutions are expensive and difficult to achieve in a standard manufacturing environments.

SUMMARY

In order to address the foregoing issues, one exemplary embodiment herein comprises an integrated circuit structure that includes a high-resistivity silicon (HRS) substrate layer comprising trench lattice structures and an ion impurity implant. A buried oxide (BOX) layer is positioned on and contacts the HRS substrate layer, and the BOX layer also fills the trench lattice structures. Further, a circuitry layer is positioned on and contacts the buried insulator layer. The circuitry layer comprises groups of active circuits separated by passive structures. The trench lattice structure is positioned between the groups of active circuits when the integrated circuit structure is viewed from a top view (where the circuitry layer is an arbitrary "top" of the integrated circuit structure and the HRS substrate is an arbitrary "bottom" of the integrated circuit structure). Therefore, such trench lattice structures are below the passive structures, but are not below the groups of circuits when the integrated circuit structure is viewed from the top view.

Another exemplary integrated circuit structure herein comprises a silicon substrate layer having trench structures and an ion impurity implant. An insulator layer is positioned on and contacts the silicon substrate layer. The insulator layer also fills the trench structures. A circuitry layer is positioned on and contacts the buried insulator layer. The circuitry layer comprises groups of active circuits separated by passive structures. The trench structures are positioned between the groups of active circuits when the integrated circuit structure is viewed from the top view. Thus, the trench structures are below the passive structures and are not below the groups of circuits when the integrated circuit structure is viewed from the top view.

An exemplary method embodiment of forming an integrated circuit structure herein patterns trench lattice structures in a HRS substrate layer and implants an ion impurity implant into the HRS substrate layer. The method forms a BOX layer on the HRS substrate layer and within the trench lattice structures and forms a circuitry layer on the buried insulator layer. The circuitry layer comprises groups of active circuits separated by passive structures. The trench lattice structures are patterned to be positioned between the groups of active circuits when the integrated circuit structure is viewed from the top view. Thus, the trench lattice structures are below the passive structures, but are not below the groups of circuits when the integrated circuit structure is viewed from the top view.

Another exemplary method herein patterns trench structures in a silicon substrate layer, implants an ion impurity implant into the silicon substrate layer, forms an insulator layer on the silicon substrate layer and within the trench structures, and forms a circuitry layer on the buried insulator layer. The circuitry layer comprises groups of active circuits separated by passive structures. The trench structures are patterned to be positioned between the groups of active circuits when the integrated circuit structure is viewed from the top view. Thus, the trench structures are below the passive structures and are not below the groups of circuits when the integrated circuit structure is viewed from the top view.

A design structure embodiment herein is tangibly embodied in a machine readable medium for designing, manufacturing, or testing an integrated circuit. The design structure comprises an integrated circuit structure that includes a silicon substrate layer having trench structures and an ion impurity implant. An insulator layer is positioned on and contacts the silicon substrate layer. The insulator layer fills the trench structures. A circuitry layer is positioned on and contacts the buried insulator layer. The circuitry layer comprises groups of active circuits separated by passive structures. The trench structures are positioned between the groups of active circuits when the integrated circuit structure is viewed from the top view. Thus, the trench structures are below the passive structures and are not below the groups of circuits when the integrated circuit structure is viewed from the top view.

DETAILED DESCRIPTION

As mentioned above, a byproduct of using HRS substrates is the possible formation of a charge layer at the handle wafer/oxide interface. To address this issue, the embodiments herein use ion implantation and lattice trenching to eliminate the charge layer, thus eliminating the need to resort to more expensive alternatives. By applying an ion implant across the whole wafer and forming a lattice of trenches between active devices (and under passive devices); the embodiments herein eliminate the charge layer described in Kerr.

Figure 1:
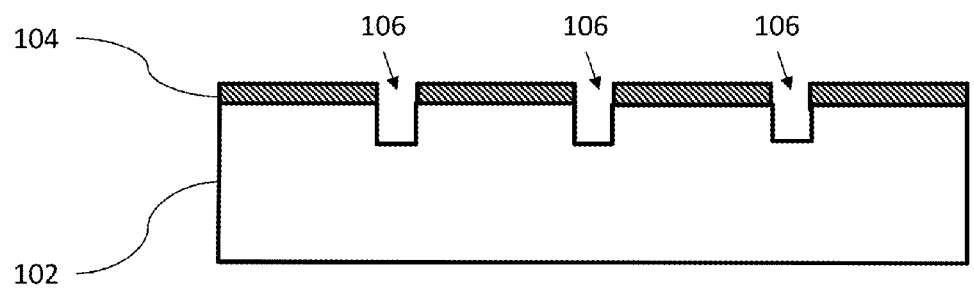
FIG. 1 is a schematic cross-sectional drawing of an integrated circuit structure according to embodiments herein.
Figure 6:
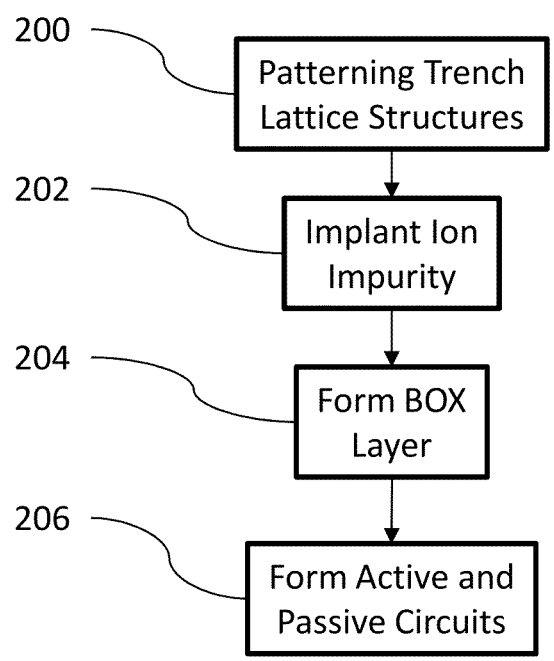
FIG. 6 is a flowchart illustrating processing steps within method embodiments herein.

More specifically, as shown in item 200 in the flowchart in FIG. 6, and schematically in FIG. 1, in exemplary methods herein, an integrated circuit structure is formed by patterning trench lattice structures 106 in a HRS substrate layer 102. The substrate 102 can comprise any suitable insulating material such as a wafer, ceramic material, insulator, silicon material, etc. The HRS substrate layer 102 has a resistivity greater than 1 kΩ-cm. If desired, the substrate 102 can include one or more doped well regions.

The trench lattice structures 106 are formed by first forming and patterning any type of masking structure 104 (such as a photoresist, nitride hard mask, etc.) to define a lattice structure. Subsequently, a material removal process (such as reactive ion etching, etc.) that is selective to the material of the substrate 102, is performed through the mask 104 to remove material from the trench regions 106. The mask 104 is then removed using a rinsing process that does not affect the substrate 102.

Figure 2:
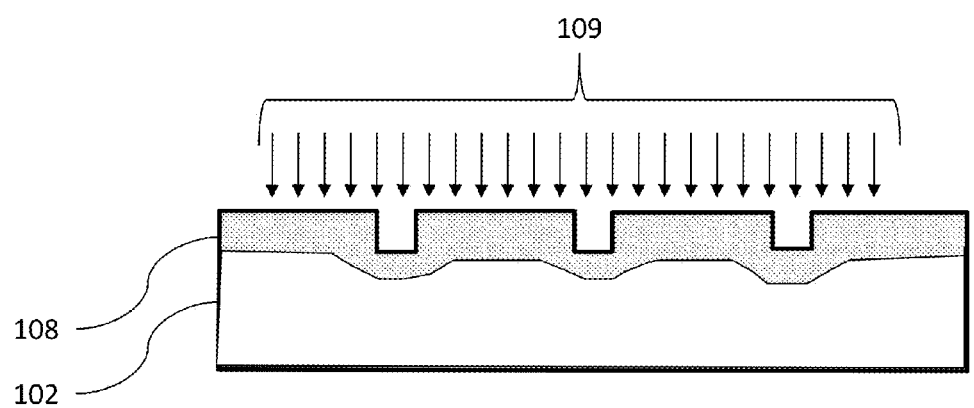
FIG. 2 is a schematic cross-sectional drawing of an integrated circuit structure according to embodiments herein.

As shown in FIG. 2, and in item 202 of FIG. 6, with methods herein an ion impurity 109 is implanted into the HRS substrate layer 102 to create an ion impurity implant 108 within the substrate 102. The ion impurity implant 108 comprises any appropriate ion generated from materials such as argon, carbon, boron, etc. implanted at any appropriate energy level and at any appropriate concentration which will vary depending upon the specific item being manufactured.

Figure 3:
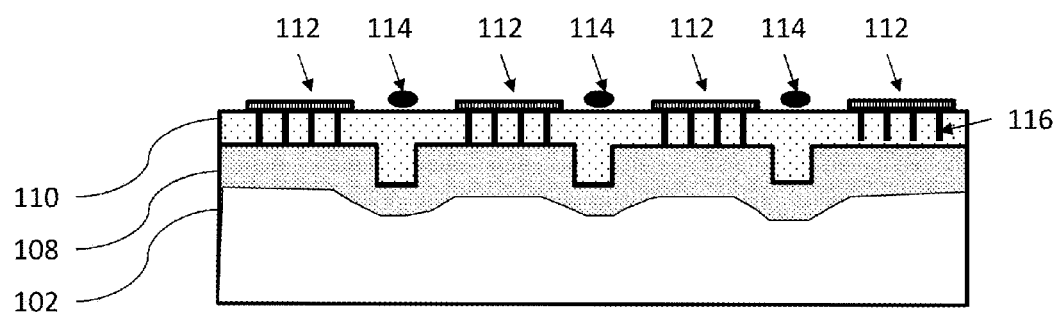
FIG. 3 is a schematic cross-sectional drawing of an integrated circuit structure according to embodiments herein.

In item 204 (FIG. 6) and as shown in FIG. 3, the method forms a buried oxide (BOX) layer 110 on the HRS substrate layer 102 and within the trench lattice structures 106. The BOX layer 110 is a dielectric (insulator) and can, for example, be grown from either a dry oxygen ambient or steam. Alternatively, the dielectric 110 may be formed (grown or deposited) using any of the many candidate high dielectric constant (high-k) materials currently available, including but not limited to silicon nitride, silicon oxynitride, a gate dielectric stack of $SiO_2$ and $Si_3N_4$, and metal oxides like tantalum oxide. The thickness of the insulator 110 may vary contingent upon the required device performance.

In item 206 in FIG. 6, and as shown in FIG. 3, the methods herein form a circuitry layer on the buried insulator layer 110. The circuitry layer comprises groups of active circuits 112 separated by passive structures 114. Body contacts 116 between the active circuits 112 and the substrate 102 can be utilized to electrically connect the body of the device to a fixed potential, to prevent floating body effects. The formation processes for such structures are well-known by those ordinarily skilled in the art, as evidenced by U.S. Patent Publication 2010/0052053, the complete disclosure of which is incorporated herein by reference.

The active circuits 112 can comprise any form of circuitry that switches from one state to another to perform logic functions (e.g., transistors) such as radio frequency (RF) circuits, power amplifier circuits, voltage control oscillator circuits, ring oscillator circuits, low noise amplifier circuits, mixer circuits, digital-to-analog converter circuits, and analog-to-digital converters circuits. The passive structures 114 generally do not switch states and can comprise, for example, resistors, capacitors, inductors, etc.

Figure 4:
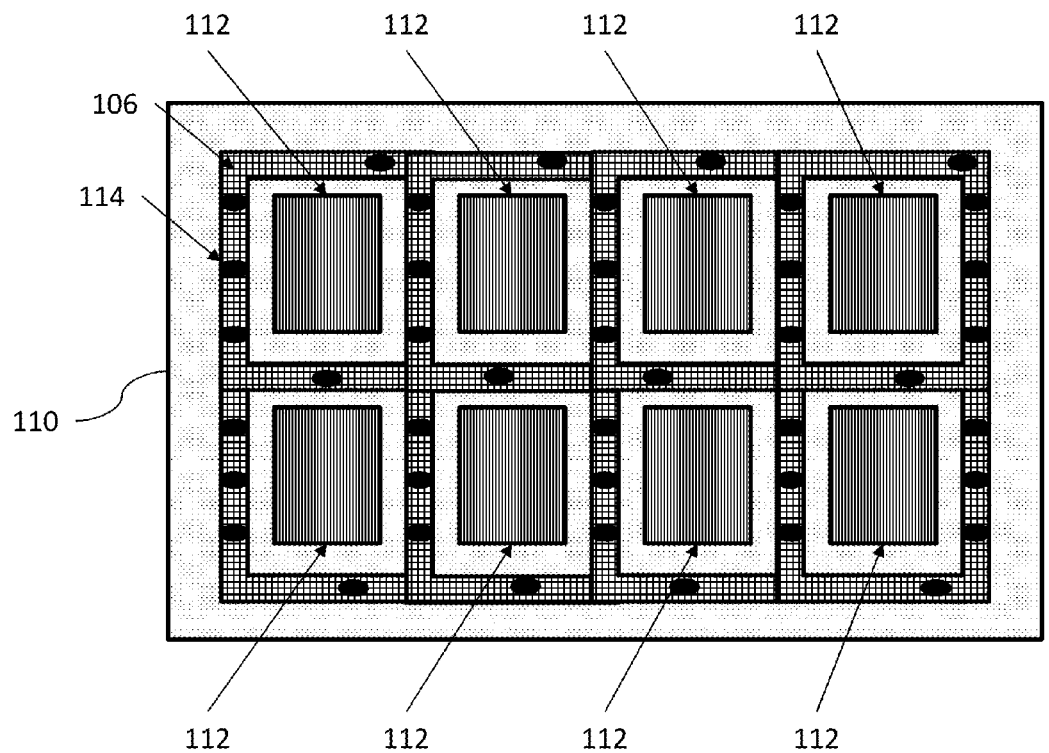
FIG. 4 is a schematic top-view drawing of an integrated circuit structure according to embodiments herein.
Figure 5:
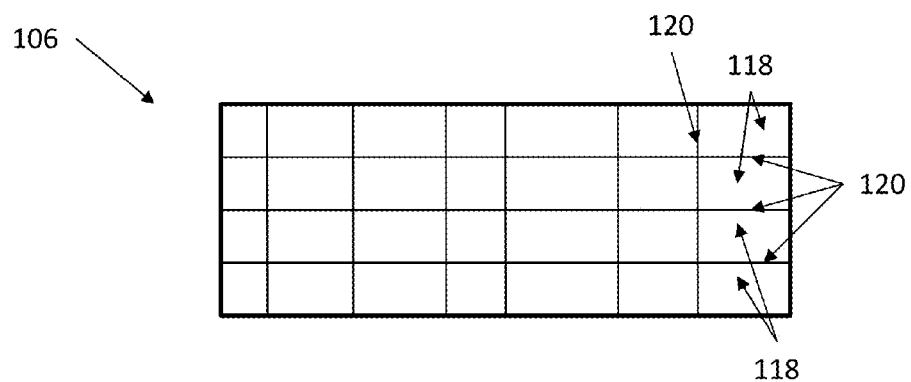
FIG. 5 is a schematic magnified-view drawing of one of the structures illustrated in FIG. 4.

FIGS. 4 and 5 illustrate the integrated circuit structure from the top view where the circuitry layer is an arbitrary "top" of the integrated circuit structure and the HRS substrate 102 is an arbitrary "bottom" of the integrated circuit structure. As shown more clearly in the top view diagram in FIGS. 4 and 5 (where the BOX layer 110 is shown in a semi-transparent manner to allow the underlying trenches to be viewed more easily) the trench lattice structures 106 are patterned in step 200 to be positioned between the subsequently formed groups of active circuits 112. FIG. 5 is an expanded (magnified) view of one portion of the trench lattice, illustrating that the structure includes a number of distinct trenches 118 separated by sidewalls 120.

Thus, the trench lattice structures 106 are below the passive structures 114, but are not below the groups of active circuits 112 when the integrated circuit structure is viewed from the top view and the trench lattice structures 106 are patterned to surround the groups of active circuits 112 when the integrated circuit structure is viewed from the top view.

As mentioned in Kerr, above, due to the low doping level of HRS substrates, even a small amount of fixed-oxide charge or interface-trapped charge can strongly affect band bending at the interface of the BOX and substrate. A Si—$SiO_2$ interface has positive fixed-oxide charge near the interface, which is strong enough to invert the Si surface. Thus, a byproduct of using HRS substrates is the possible formation of a charge layer at the handle wafer/oxide interface. The fixed-oxide and interface charges induce a parasitic surface conduction layer, which is an electron inversion layer. This inversion layer, partially spoils the expected benefits in substrate loss and coupling. Many solutions have been proposed to address this situation; however, such solutions are expensive and difficult to achieve in a standard manufacturing environments.

Therefore, the embodiments herein use ion implantation and lattice trenching to eliminate the charge layer, thus eliminating the need to resort to more expensive alternatives. By applying an ion implant across the whole wafer and forming a lattice of trenches between active devices (and under passive devices) the embodiments herein eliminate the charge layer described in Kerr to achieve designs goals for RF functions such as high power switches. The embodiments herein are useful in various high speed applications, such as power amplifiers (PAs), voltage control oscillators (VCOs), ring oscillators (ROs), low noise amplifiers (LNAs), mixers, digital to analog converters (DACs) and analog to digital converters (ADCs). The trenching performed by embodiments herein is also used to isolate circuit block functions from one another.

Figure 7:
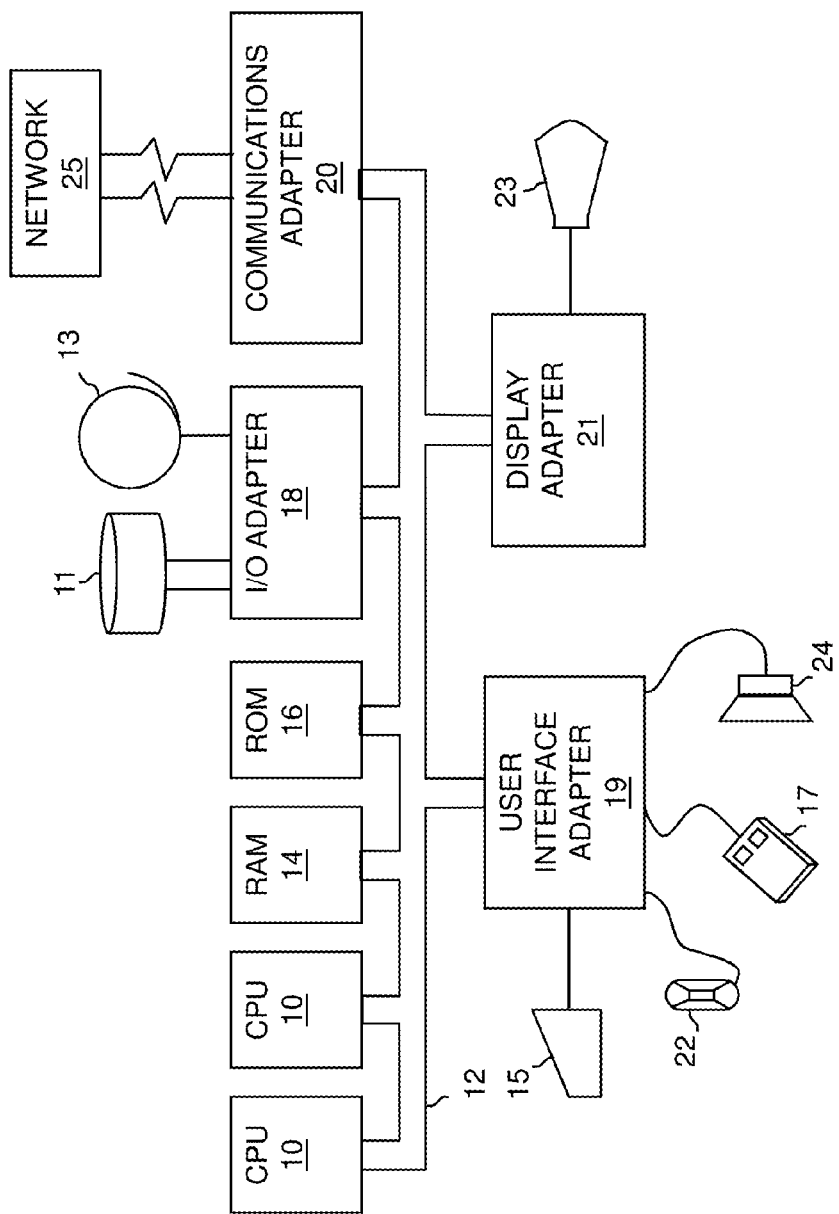
FIG. 7 is a schematic cross-sectional drawing of a hardware structure according to embodiments herein.

A representative hardware environment for practicing the embodiments of the invention is depicted in FIG. 7. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 8:
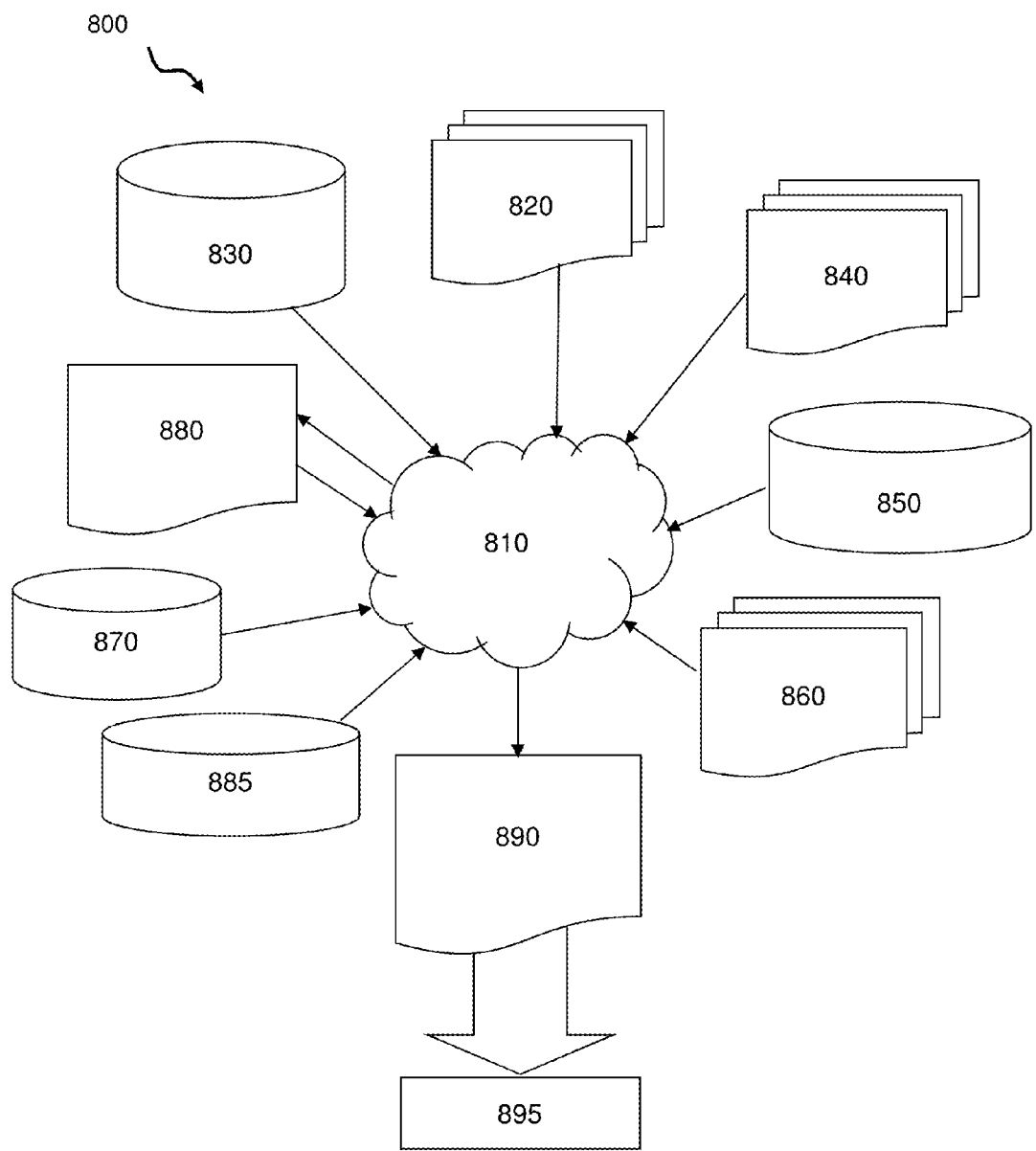
FIG. 8 is a block diagram of an exemplary design flow according to embodiments herein.

FIG. 8 shows a block diagram of an exemplary design flow 800 used for example, in semiconductor IC logic design, simulation, test, layout, and manufacture. Design flow 800 includes processes, machines and/or mechanisms for processing design structures or devices to generate logically or otherwise functionally equivalent representations of the design structures and/or devices described above and shown in [fill in figure or figures that represent the design]. The design structures processed and/or generated by design flow 800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer.

When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown in [fill in figure or figures that represent the design]. As such, design structure 820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in [fill in figure or figures that represent the design] to generate a netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 810 may include hardware and software modules for processing a variety of input data structure types including netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885 which may include input test patterns, output test results, and other testing information. Design process 810 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 810 without deviating from the scope and spirit of the invention. Design process 810 may also include modules for performing standard circuit design processes such as timing analysis, verification, design rule checking, place and route operations, etc.

Design process 810 employs and incorporates logic and physical design tools such as HDL compilers and simulation model build tools to process design structure 820 together with some or all of the depicted supporting data structures along with any additional mechanical design or data (if applicable), to generate a second design structure 890. Design structure 890 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures).

Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown in [fill in figure or figures that represent the design]. In one embodiment, design structure 890 may comprise a compiled, executable HDL simulation model that functionally simulates the devices shown in [fill in figure or figures that represent the design].

Design structure 890 may also employ a data format used for the exchange of layout data of integrated circuits and/or symbolic data format (e.g. information stored in a GDSII (GDS2), GL1, OASIS, map files, or any other suitable format for storing such design data structures). Design structure 890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in [fill in figure or figures that represent the design]. Design structure 890 may then proceed to a stage 895 where, for example, design structure 890: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An integrated circuit structure comprising:
    a high-resistivity silicon (HRS) substrate layer comprising trench lattice structures and an ion impurity implant;
    a buried oxide (BOX) layer positioned on and contacting said HRS substrate layer, said BOX layer filing said trench lattice structures; and
    a circuitry layer positioned on and contacting said BOX layer, said circuitry layer comprising groups of active circuits separated by passive structures, said trench lattice structures being positioned between said groups of active circuits when said integrated circuit structure is viewed from a top view where said circuitry layer is a top of said integrated circuit structure and said HRS substrate layer is a bottom of said integrated circuit structure, such that said trench lattice structures are below said passive structures and are not below said groups of circuits when said integrated circuit structure is viewed from said top view, and said trench lattice structures surrounding said groups of active circuits when said integrated circuit structure is viewed from said top view.

2. The integrated circuit structure according to claim 1, said HRS substrate layer having a resistivity greater than 1 kΩ-cm.

3. The integrated circuit structure according to claim 1, said ion impurity implant comprising argon, carbon, and boron.

4. The integrated circuit structure according to claim 1, said active circuits comprising radio frequency (RF) circuits, power amplifier circuits, voltage control oscillator circuits, ring oscillator circuits, low noise amplifier circuits, mixer circuits, digital-to-analog converter circuits, and analog-to-digital converters circuits.

5. An integrated circuit structure comprising:
   a silicon substrate layer comprising trench lattice structures and an ion impurity implant;
   an insulator layer positioned on and contacting said silicon substrate layer, said insulator layer filing said trench lattice structures; and
   a circuitry layer positioned on and contacting said insulator layer,
   said circuitry layer comprising groups of active circuits separated by passive structures,
   said trench lattice structures being positioned between said groups of active circuits when said integrated circuit structure is viewed from a top view where said circuitry layer is a top of said integrated circuit structure and said silicon substrate is a bottom of said integrated circuit structure, such that said trench lattice structures are below said passive structures and are not below said groups of circuits when said integrated circuit structure is viewed from said top view, and
   said trench lattice structures surrounding said groups of active circuits when said integrated circuit structure is viewed from said top view.

6. The integrated circuit structure according to claim 5, said silicon substrate layer having a resistivity greater than 1 kΩ-cm.

7. The integrated circuit structure according to claim 5, said ion impurity implant comprising argon, carbon, and boron.

8. The integrated circuit structure according to claim 5 said active circuits comprising radio frequency (RF) circuits, power amplifier circuits, voltage control oscillator circuits, ring oscillator circuits, low noise amplifier circuits, mixer circuits, digital-to-analog converter circuits, and analog-to-digital converters circuits.

9. A method of forming an integrated circuit structure, said method comprising:
   patterning trench lattice structures in a high-resistivity silicon (HRS) substrate layer;
   implanting an ion impurity implant into said HRS substrate layer;
   forming a buried oxide (BOX) layer on said HRS substrate layer and within said trench lattice structures; and
   forming a circuitry layer on said BOX layer,
   said circuitry layer comprising groups of active circuits separated by passive structures,
   said trench lattice structures being patterned to be positioned between said groups of active circuits when said integrated circuit structure is viewed from a top view where said circuitry layer is a top of said integrated circuit structure and said HRS substrate layer is a bottom of said integrated circuit structure, such that said trench lattice structures are below said passive structures and are not below said groups of circuits when said integrated circuit structure is viewed from said top view, and
   said trench lattice structures being patterned to surround said groups of active circuits when said integrated circuit structure is viewed from said top view.

10. The method according to claim 9, said HRS substrate layer having a resistivity greater than 1 kΩ-cm.

11. The method according to claim 9, said ion impurity implant comprising argon, carbon, and boron.

12. The method according to claim 9, said active circuits comprising radio frequency (RF) circuits, power amplifier circuits, voltage control oscillator circuits, ring oscillator circuits, low noise amplifier circuits, mixer circuits, digital-to-analog converter circuits, and analog-to-digital converters circuits.

13. A method of forming an integrated circuit structure, said method comprising:
   patterning trench lattice structures in a silicon substrate layer;
   implanting an ion impurity implant into said silicon substrate layer;
   forming an insulator layer on said silicon substrate layer and within said trench lattice structures; and
   forming a circuitry layer on said insulator layer,
   said circuitry layer comprising groups of active circuits separated by passive structures,
   said trench lattice structures being patterned to be positioned between said groups of active circuits when said integrated circuit structure is viewed from a top view where said circuitry layer is a top of said integrated circuit structure and said silicon substrate is a bottom of said integrated circuit structure, such that said trench lattice structures are below said passive structures and are not below said groups of circuits when said integrated circuit structure is viewed from said top view, and
   said trench lattice structures being patterned to surround said groups of active circuits when said integrated circuit structure is viewed from said top view.

14. The method according to claim 13, said silicon substrate layer having a resistivity greater than 1 kΩ-cm.

15. The method according to claim 13, said ion impurity implant comprising argon, carbon, and boron.

16. The method according to claim 13, said active circuits comprising radio frequency (RF) circuits, power amplifier circuits, voltage control oscillator circuits, ring oscillator circuits, low noise amplifier circuits, mixer circuits, digital-to-analog converter circuits, and analog-to-digital converters circuits.

* * * * *